United States Patent
Wu

(10) Patent No.: US 7,652,923 B2
(45) Date of Patent: Jan. 26, 2010

(54) SEMICONDUCTOR DEVICE AND MEMORY AND METHOD OF OPERATING THEREOF

(75) Inventor: Chao-I Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 294 days.

(21) Appl. No.: 11/670,600

(22) Filed: Feb. 2, 2007

(65) Prior Publication Data

US 2008/0186779 A1    Aug. 7, 2008

(51) Int. Cl.
*G11C 16/04* (2006.01)

(52) U.S. Cl. .......................... 365/185.18; 365/185.27; 365/185.26; 365/185.28; 365/185.29

(58) Field of Classification Search ............ 365/185.18, 365/185.27, 185.26, 185.29, 185.28
See application file for complete search history.

(56) References Cited

U.S. PATENT DOCUMENTS

| | | | |
|---|---|---|---|
| 3,893,151 A | 7/1975 | Bosselaar et al. ............. 357/23 |
| 4,298,962 A * | 11/1981 | Hamano et al. ............. 365/182 |
| 4,459,684 A * | 7/1984 | Chapman .................... 365/174 |
| 4,503,524 A * | 3/1985 | McElroy ................ 365/185.26 |
| 5,467,306 A * | 11/1995 | Kaya et al. ............... 365/185.2 |
| 5,714,766 A * | 2/1998 | Chen et al. .................... 257/17 |
| 5,761,127 A * | 6/1998 | Akaogi et al. .......... 365/185.27 |
| 6,011,725 A | 1/2000 | Eitan |
| 6,069,380 A | 5/2000 | Chou et al. |
| 6,140,676 A * | 10/2000 | Lancaster .................... 257/315 |
| 6,445,617 B1 * | 9/2002 | Sakakibara ............ 365/185.22 |
| 6,574,149 B2 * | 6/2003 | Einaga et al. .......... 365/185.29 |
| 6,847,556 B2 * | 1/2005 | Cho ....................... 365/185.28 |
| 6,882,574 B2 | 4/2005 | Yang et al. |
| 6,903,407 B1 * | 6/2005 | Kang ......................... 257/315 |
| 6,928,021 B2 * | 8/2005 | Pecheyran et al. ........ 365/225.7 |
| 6,979,856 B2 * | 12/2005 | Nishizaka et al. ........... 257/314 |
| 7,045,848 B2 * | 5/2006 | Shukuri ....................... 257/311 |
| 7,151,292 B1 | 12/2006 | Wong .......................... 257/314 |
| 7,164,167 B2 * | 1/2007 | Iwata et al. .................. 257/315 |
| 7,184,316 B2 * | 2/2007 | Cho et al. ............... 365/185.28 |
| 7,187,590 B2 * | 3/2007 | Zous et al. ................ 365/185.3 |
| 7,193,900 B2 * | 3/2007 | Thomas ................. 365/185.29 |
| 7,339,827 B2 * | 3/2008 | Yasui et al. ............. 365/185.18 |
| 7,352,631 B2 * | 4/2008 | Burnett et al. ......... 365/185.24 |
| 7,394,702 B2 * | 7/2008 | Ding et al. ............. 365/185.29 |
| 7,471,568 B2 * | 12/2008 | Wu ........................ 365/185.24 |
| 7,483,285 B2 * | 1/2009 | Furukawa et al. ............. 365/51 |
| 7,483,299 B2 * | 1/2009 | Hsu et al. ................. 365/185.1 |

FOREIGN PATENT DOCUMENTS

CN    1420553    5/2003

OTHER PUBLICATIONS

Chinese $2^{nd}$ Examination Report of China Application No. 2007100075347, dated Jul. 24, 2009.

* cited by examiner

*Primary Examiner*—Viet Q Nguyen
(74) *Attorney, Agent, or Firm*—J.C. Patents

(57) ABSTRACT

A memory applicable to an embedded memory is provided. The memory includes a substrate, a gate, a charge-trapping gate dielectric layer, a source, and a drain. The gate is disposed above the substrate. The charge-trapping gate dielectric layer is disposed between the gate and the substrate. The source and the drain are disposed in the substrate beside the gate respectively.

12 Claims, 3 Drawing Sheets

SEMICONDUCTOR DEVICE AND MEMORY AND METHOD OF OPERATING THEREOF

BACKGROUND OF THE INVENTION

1. Field of the Invention

The present invention relates to an integrated circuit. More particularly, the present invention relates to a semiconductor device and a memory having a structure similar to a transistor of a common logic device and a method of operating thereof.

2. Description of Related Art

Among various types of semiconductor devices, memories in which data can be stored, read out or erased and having the advantage that the data stored therein can be retained even after power is cut off has become a memory device widely applied in personal computers and electronic apparatuses.

Generally speaking, in order to reduce the manufacturing cost of the semiconductor device and simplify the process, it gradually becomes a trend to integrate elements of a memory and a logic circuit on the same system, which is also known as an embedded memory. To be specific, in a conventional embedded memory structure, the transistor used as the memory and the transistor used as the logic device are formed on the same system.

However, for the conventional embedded memory, the processes of fabricating the transistor in the memory region and the logic circuit region are two different transistor processes. Since the transistor used as the memory has two poly-Si layers to serve as a control gate and a floating gate, and the transistor used as the logic device has only one poly-Si layer to serve as a gate, the two transistors have different structures. Moreover, the transistor used as the memory and the transistor used as the logic device have different requirements on characteristics. Therefore, the process of manufacturing the embedded memory becomes difficult, thereby influencing the process yield.

SUMMARY OF THE INVENTION

The present invention is directed to providing a semiconductor device. On the same system, a metal oxide semiconductor transistor and a memory in the semiconductor device are simultaneously forming. The process of manufacturing the semiconductor device becomes easy, thereby improving the process yield.

The present invention is directed to providing a memory and an operating method thereof. The memory is applicable to an embedded memory, and has the function of storing data.

The present invention provides a semiconductor device. The semiconductor device comprises a substrate, a metal oxide semiconductor transistor and a memory. The substrate has a logic circuit region and a memory region. The metal oxide semiconductor transistor is disposed in the logic circuit region, and the metal oxide semiconductor transistor comprising a substrate, a drain and a source disposed in the substrate, a gate disposed between the drain and the source and above the substrate, and a gate dielectric layer disposed between the gate and the substrate. The memory is disposed in the memory region, the memory and the metal oxide semiconductor transistor are the same stacked structure having the same material, and the memory comprising a substrate, a drain and a source disposed in the substrate, a gate disposed between the drain and the source and above the substrate, and a charge-trapping gate dielectric layer disposed between the gate and the substrate.

In the memory according to an embodiment of the present invention, the thickness of the charge-trapping gate dielectric layer is between 20 Å and 200 Å. The charge-trapping gate dielectric layer comprises a doped silicon oxide layer, a nitrided silicon dioxide layer, a deposited silicon oxide layer, a silicon oxynitride layer, or a silicon nitride layer.

In the memory according to an embodiment of the present invention, the gate comprises an N-type doped polysilicon layer or a P-type doped polysilicon layer. In addition, the gate is a metal gate.

In the memory according to an embodiment of the present invention, the source and the drain are the same, which comprises an N-type doped region or a P-type doped region.

In the memory according to an embodiment of the present invention, the memory is a one time programmable memory or an erasable/programmable memory.

The present invention further provides a memory applicable to an embedded memory. The memory comprises a substrate, a gate, a charge-trapping gate dielectric layer, a source, and a drain. The gate is disposed above the substrate. The charge-trapping gate dielectric layer is disposed between the gate and the substrate. The source and the drain are disposed in the substrate beside the gate respectively.

In the memory according to an embodiment of the present invention, the thickness of the charge-trapping gate dielectric layer is between 20 Å and 200 Å. The charge-trapping gate dielectric layer comprises a doped silicon oxide layer, a nitrided silicon dioxide layer, a deposited silicon oxide layer, a silicon oxynitride layer, or a silicon nitride layer.

In the memory according to an embodiment of the present invention, the gate comprises an N-type doped polysilicon layer or a P-type doped polysilicon layer. In addition, the gate is a metal gate.

In the memory according to an embodiment of the present invention, the source and the drain are the same, which comprises an N-type doped region or a P-type doped region.

In the memory according to an embodiment of the present invention, the memory is a one time programmable memory or an erasable/programmable memory.

The present invention further provides a method of operating a memory. The memory comprises a substrate, a drain and a source disposed in the substrate, a gate disposed between the drain and the source and above the substrate, and a charge-trapping gate dielectric layer disposed between the gate and the substrate. The method of operating the present invention comprises performing an erasing operation so as to inject holes into the charge-trapping gate dielectric layer to erase the memory, and performing a programming operation so as to pull the holes from the charge-trapping gate dielectric layer to the substrate to program the memory. The erase operation comprises applying a first gate voltage on the gate, applying a first drain voltage on the drain, applying a first source voltage on the source, and applying a first substrate voltage on the substrate. The program operation comprises applying a second gate voltage on the gate, applying a second drain voltage on the drain, applying a second source voltage on the source, and applying a second substrate voltage on the substrate.

In the method of operating a memory according to an embodiment of the present invention, the first gate voltage is between −14 V and −20 V. The second gate voltage is between 14 V and 20 V. The first drain voltage, the first source voltage, and the first substrate voltage are 0 V. The second drain voltage, the second source voltage, and the second substrate voltage are 0 V.

In the method of operating a memory according to an embodiment of the present invention, the thickness of the charge-trapping gate dielectric layer is between 20 Å and 200 Å. The charge-trapping gate dielectric layer comprises a doped silicon oxide layer a nitrided silicon dioxide layer, a deposited silicon oxide layer, a silicon oxynitride layer, or a silicon nitride layer.

In the method of operating a memory according to an embodiment of the present invention, the gate comprises an N-type doped polysilicon layer or a P-type doped polysilicon layer. In addition, the gate is a metal gate.

In the method of operating a memory according to an embodiment of the present invention, the source and the drain are the same, which comprises an N-type doped region or a P-type doped region.

In the method of operating a memory according to an embodiment of the present invention, the memory is a one time programmable memory or an erasable/programmable memory.

In the present invention, the charge-trapping gate dielectric layer disposed between the gate and the substrate of the memory is used as a charge-trapping layer of the memory, such that the memory has the function of storing the data. On the other hand, the structure of the memory in the present invention is similar to that of the transistor of a common logic device, and thus it can be applied into an embedded memory. In other words, on the same system a transistor of a logic device and a memory in the present invention can be simultaneously forming, thereby increasing the process yield and simplifying the process.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
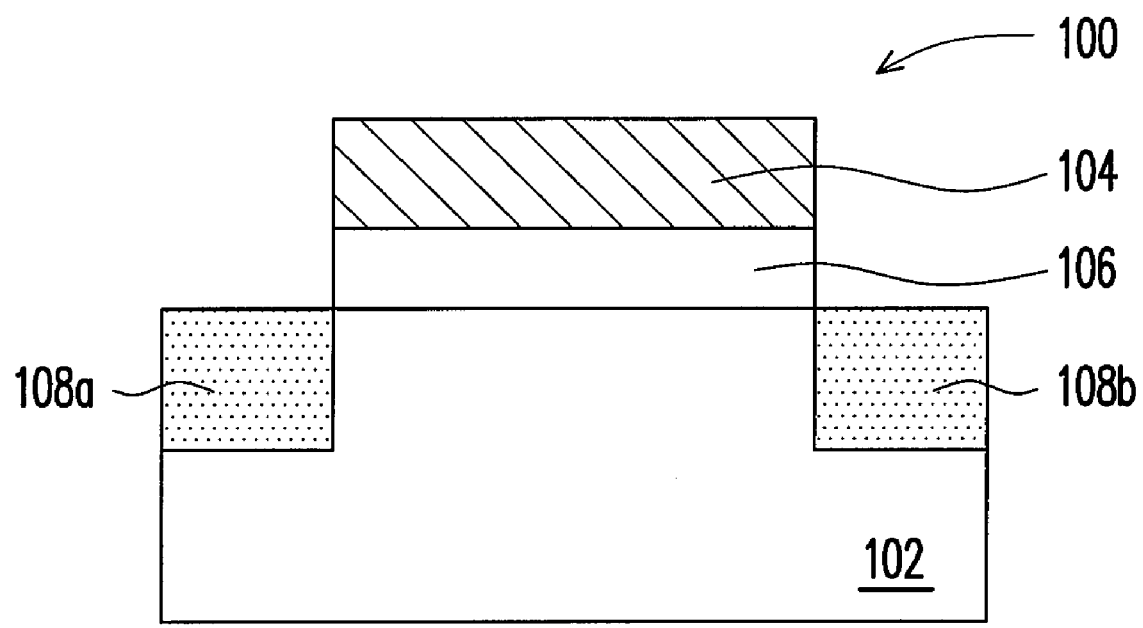
FIG. 1 is a schematic sectional view of a memory according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

In integrated circuit of prior art, the elements of a memory and a logic circuit are integrated on the same system. And, the manufacturing process becomes difficult, thereby influencing the process yield. Therefore, a semiconductor device is provided to solve the above mentioned issues. The semiconductor device comprises a metal oxide semiconductor transistor disposed in the logic circuit region and a memory disposed in the memory region. The metal oxide semiconductor transistor comprising a substrate, a drain and a source disposed in the substrate, a gate disposed between the drain and the source and above the substrate, and a gate dielectric layer disposed between the gate and the substrate. The memory comprising a substrate, a drain and a source disposed in the substrate, a gate disposed between the drain and the source and above the substrate, and a charge-trapping gate dielectric layer disposed between the gate and the substrate.

In particular, the memory and the metal oxide semiconductor transistor are the same stacked structure having the same material so as to the process of manufacturing the semiconductor device in the present invention becomes easy, thereby increasing the process yield.

Moreover, the metal oxide semiconductor transistor of the present invention is a common metal oxide semiconductor transistor and that is all known to those skilled in the art, and will not be described herein. The memory in the semiconductor device of the present invention is shown by using FIG. 1.

FIG. 1 is a schematic sectional view of a memory according to an embodiment of the present invention.

Referring to FIG. 1, the memory 100 in this embodiment includes a substrate 102, a gate 104, a charge-trapping gate dielectric layer 106, a source 108a, and a drain 108b. The substrate 102 is, for example, a P-type silicon substrate. The gate 104 is disposed above the substrate 102. The gate 104 is, for example, an N-type doped polysilicon layer or a P-type doped polysilicon layer. In addition, the gate 104 is further, for example, a metal gate, and the material thereof is, for example, metal, metal alloy or metal silicide used by a common metal gate. The source 108a and the drain 108b are disposed in the substrate 102 beside the gate 104 respectively. The source 108a and the drain 108b are, for example, N-type doped regions.

In another embodiment, the substrate 102 of the memory 100 is, for example, an N-type silicon substrate, and the source 108a and the drain 108b are, for example, P-type doped regions.

The charge-trapping gate dielectric layer 106 of this embodiment is disposed between the gate 104 and the substrate 102. The thickness of the charge-trapping gate dielectric layer 106 is between 20 Å and 200 Å, and preferably around 90 Å. Films having lower purity are using in the charge-trapping gate dielectric layer 106 so that the charge-trapping gate dielectric layer 106 has the function of trapping charges. In addition, the charge-trapping gate dielectric layer 106 is, for example, a doped silicon oxide layer, a nitrided silicon dioxide layer, or a deposited silicon oxide layer. That is, the charge-trapping gate dielectric layer 106 is, for example, a silicon oxide layer formed by ion implantation, nitridation, or deposition. The deposition is, for example, chemical vapor deposition (CVD). In addition, the charge-trapping gate dielectric layer 106 is, for example, a silicon oxynitride layer or a silicon nitride layer.

It should be noted that the memory 100 in this embodiment uses the charge-trapping gate dielectric layer 106 as a charge-trapping layer of the memory 100, such that the memory has the function of storing data. On the other hand, the transistor of a common logic device includes a silicon oxide layer formed by thermal oxidation and disposed between the substrate and the gate, and the memory 100 of this embodiment includes a charge-trapping gate dielectric layer 106 disposed between the gate 104 and the substrate 102. It can be known that the structure of the memory 100 of this embodiment is similar to that of the transistor of the common logic device. Therefore, the memory 100 of this embodiment can be applied into an embedded memory. In other words, on the same system a transistor of a logic device and a memory in the present invention can be simultaneously forming, thereby increasing the process yield and simplifying the process.

Moreover, the memory in the present invention can be used as a one time programmable memory. In addition, the memory of the present invention can also be sued as an erasable/programmable memory.

The operating method of a memory of the present invention is illustrated by using the memory 100 of the above embodiment. The operating method of a memory of the present invention includes performing an erasing operation (as shown in FIG. 2A), and performing a programming operation (as shown in FIG. 2B).

Figure 2A:
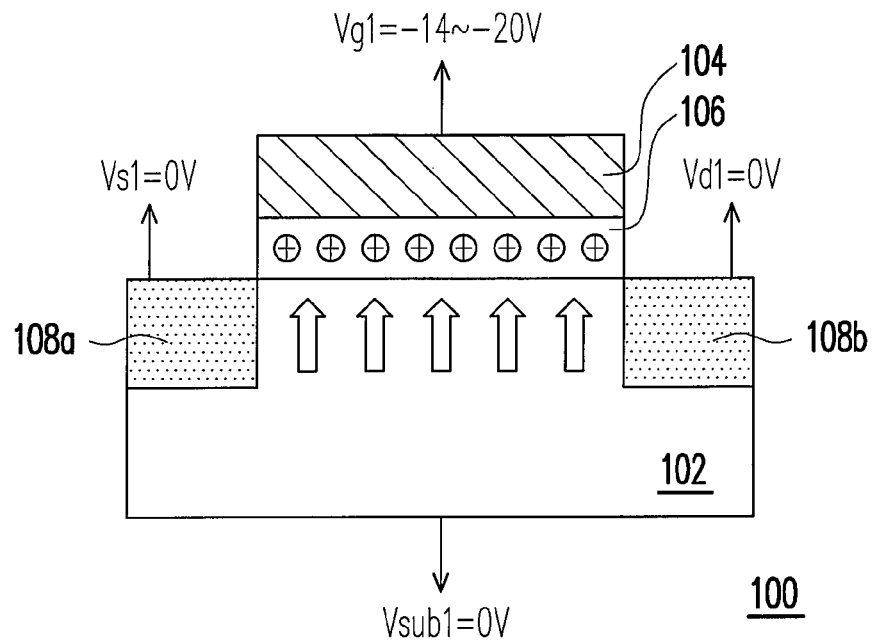
FIG. 2A is a schematic view of the erasing operation of the memory according to the present invention.

First, referring to FIG. 2A, a schematic view of the erasing operation of the memory according to the present invention is shown. When performing the erasing operation to the memory 100, a first gate voltage Vg1 is applied on the gate 104, and the first gate voltage. Vg1 is, for example, between −14 V and −20 V. A first source voltage Vs1 is applied on the source 108a, and the first source voltage Vs1 is, for example, 0 V. A first drain voltage Vd1 is applied on the drain 108b, and the first drain voltage Vd1 is, for example, 0 V. A first substrate voltage Vsub1 is applied on the substrate 102, and the first substrate voltage Vsub1 is, for example, 0 V. In this manner, when performing the erasing operation, holes are injected into the charge-trapping gate dielectric layer 106 from the substrate 102, so as to erase the memory 100.

Figure 2B:
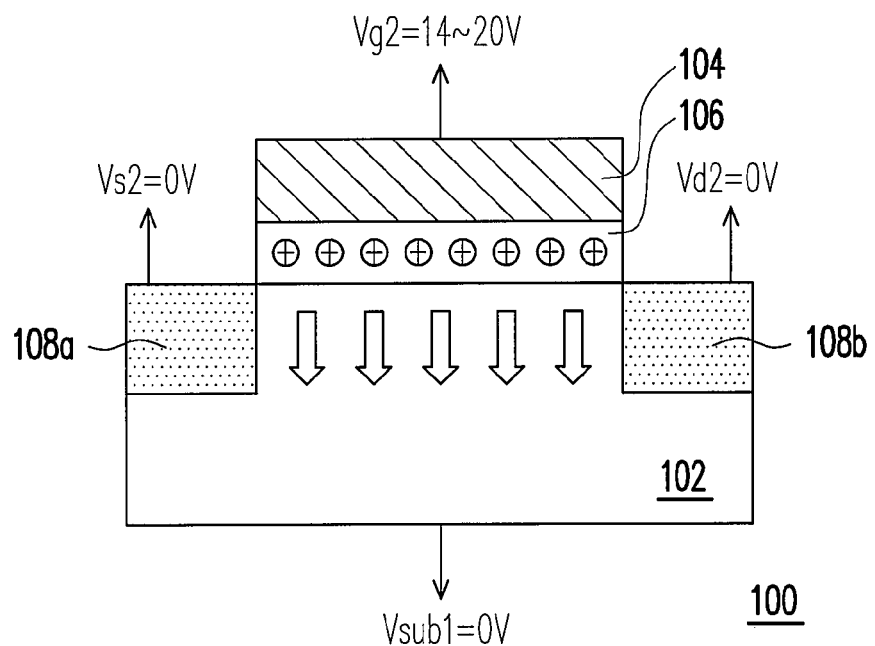
FIG. 2B is a schematic view of the programming operation of the memory according to the present invention.

Referring to FIG. 2B, a schematic view of the programming operation of the memory according to the present invention is shown. When performing the programming operation to the memory 100, a second gate voltage Vg2 is applied on the gate 104, and the second gate voltage Vg2 is, for example, between 14 V and 20 V. A second source voltage Vs2 is applied on the source 108a, and the second source voltage Vs2 is, for example, 0 V. A second drain voltage Vd2 is applied on the drain 108b, and the second drain voltage Vd2 is, for example, 0 V. A second substrate voltage Vsub2 is applied on the substrate 102, and the second substrate voltage Vsub2 is, for example, 0 V. In this manner, when performing the programming operation, the holes are pulled from the charge-trapping gate dielectric layer 106 to the substrate 102, so as to program the memory 100.

Hereinafter, a capacitance-voltage relation diagram when operating the memory is used to illustrate that the memory in the present invention has a memory function.

Figure 3:
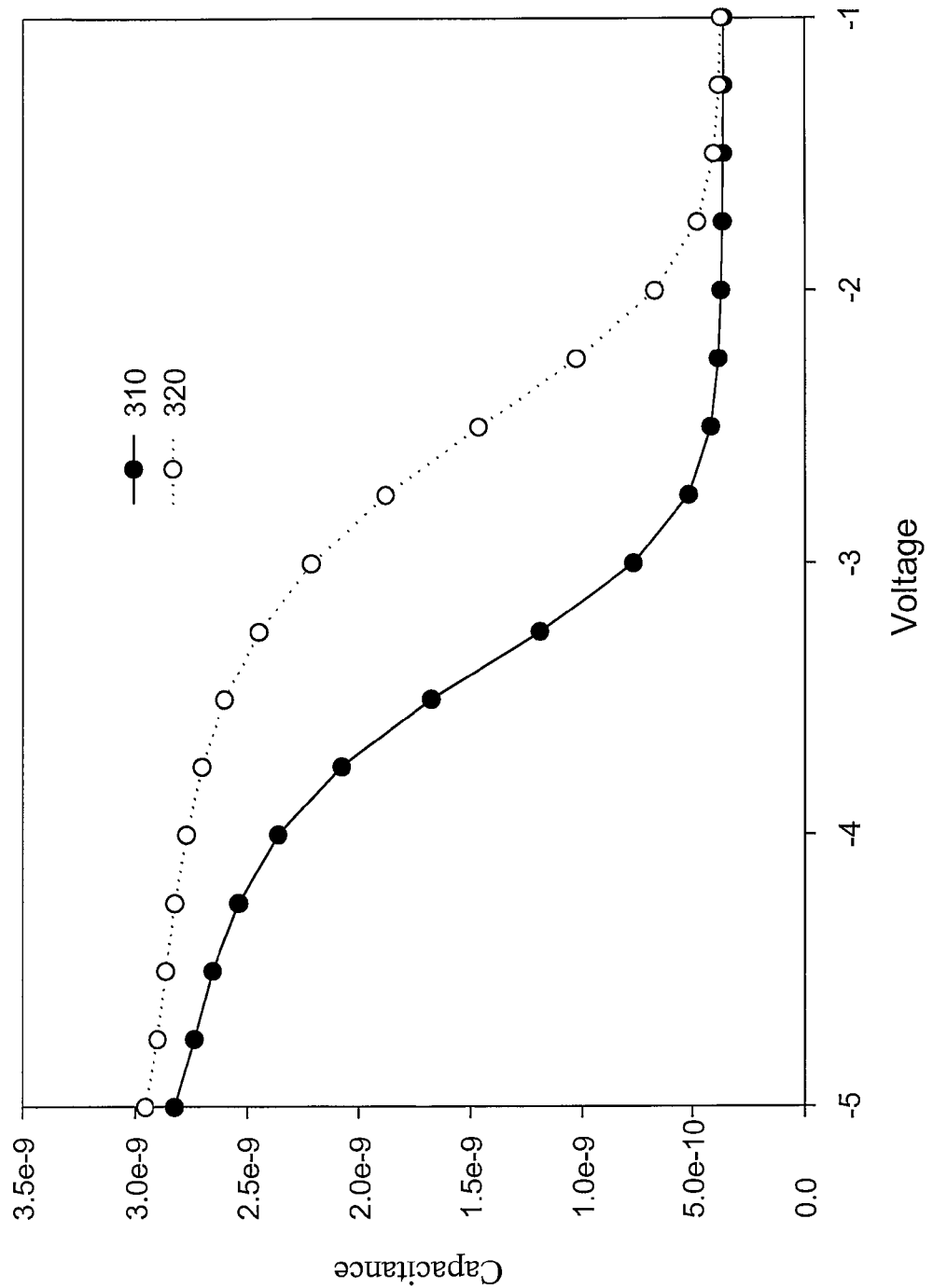
FIG. 3 is a capacitance-voltage relation diagram when operating the memory according to the present invention.

Referring to FIG. 3, a capacitance-voltage relation diagram when operating the memory according to the present invention is shown. In the figure, a curve 310 represents a capacitance-voltage curve (C-V curve) when performing the erasing operation to the memory. The erasing operation is performed under the condition that the first gate voltage Vg1 is −18 V and the first source voltage Vs1, the first drain voltage Vd1, and the first substrate voltage Vsub1 are 0 V. As such, the holes are injected into the charge-trapping gate dielectric layer 106, thereby reducing the critical voltage of the memory. Moreover, the curve 320 in the figure represents a C-V curve when performing the programming operation to the memory. The programming operation is performed under the condition that the second gate voltage Vg2 is 18 V and the second source voltage Vs2, the second drain voltage Vd2, and the second substrate voltage Vsub2 are 0 V. As such, the holes can be pulled from the charge-trapping gate dielectric layer 106, thereby increasing the critical voltage of the memory. Therefore, it can be known that the memory of the present invention can perform erasing and programming operations after being applied with voltages.

In view of the above, the structure of the memory of the present invention is similar to that of the transistor of a common logic device, so the memory can be applied into the embedded memory. In other words, on the same system a transistor of a logic device and a memory in the present invention can be simultaneously forming, thereby increasing the process yield and simplifying the process. Moreover, the memory can be used as a one time programmable memory or an erasable/programmable memory.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of operating a memory, the memory comprising a substrate, a drain and a source disposed in the substrate, a gate disposed between the drain and the source and above the substrate, and a charge-trapping gate dielectric layer disposed between the gate and the substrate, the operating method comprising:

performing an erasing operation, wherein a first gate voltage is applied on the gate, a first drain voltage is applied on the drain, a first source voltage is applied on the source, and a first substrate voltage is applied on the substrate, so as to inject holes into the charge-trapping gate dielectric layer to erase the memory; and performing a programming operation, wherein a second gate voltage is applied on the gate, a second drain voltage is applied on the drain, a second source voltage is applied on the source, and a second substrate voltage is applied on the substrate, so as to pull the holes from the charge-trapping gate dielectric layer to the substrate to program the memory.

2. The method of operating a memory as claimed in claim 1, wherein the first gate voltage is between −14 V and −20 V.

3. The method of operating a memory as claimed in claim 1, wherein the second gate voltage is between 14 V and 20 V.

4. The method of operating a memory as claimed in claim 1, wherein the first drain voltage, the first source voltage, and the first substrate voltage are 0 V.

5. The method of operating a memory as claimed in claim 1, wherein the second drain voltage, the second source voltage, and the second substrate voltage are 0 V.

6. The method of operating a memory as claimed in claim 1, wherein the thickness of the charge-trapping gate dielectric layer is between 20 Å and 200 Å.

7. The method of operating a memory as claimed in claim 1, wherein the charge-trapping gate dielectric layer comprises a doped silicon oxide layer, a nitrided silicon dioxide layer, a deposited silicon oxide layer, a silicon oxynitride layer, or a silicon nitride layer.

8. The method of operating a memory as claimed in claim 1, wherein the gate comprises an N-type doped polysilicon layer or a P-type doped polysilicon layer.

9. The method of operating a memory as claimed in claim 1, wherein the gate is a metal gate.

10. The method of operating a memory as claimed in claim 1, wherein the source and the drain are the same, which comprises an N-type doped region or a P-type doped region.

11. The method of operating a memory as claimed in claim 1, wherein the memory is a one time programmable memory.

12. The method of operating a memory as claimed in claim 1, wherein the memory is an erasable/programmable memory.

* * * * *